United States Patent [19]

Yamada

[11] Patent Number: 4,926,336
[45] Date of Patent: May 15, 1990

[54] ROUTE SEARCHING SYSTEM OF NAVIGATION APPARATUS

[75] Inventor: Takashi Yamada, Anjo, Japan

[73] Assignees: Aisin AW Co., Ltd., Aichi; Kabushiki Kaisha Shinsangyokaihatsu, Tokyo, both of Japan

[21] Appl. No.: 290,207

[22] Filed: Dec. 27, 1988

[30] Foreign Application Priority Data

Dec. 28, 1987 [JP] Japan .............................. 62-333039

[51] Int. Cl.$^5$ ............................................. G06F 15/50
[52] U.S. Cl. ................................... 364/444; 364/449; 340/990; 340/995
[58] Field of Search ..................... 364/443, 444, 449; 73/178 R; 340/988, 990, 995

[56] References Cited

U.S. PATENT DOCUMENTS

| | | | |
|---|---|---|---|
| 4,570,227 | 2/1986 | Tachi et al. | 340/995 |
| 4,796,189 | 1/1989 | Nakayama et al. | 340/990 |

*Primary Examiner*—Gary Chin
*Attorney, Agent, or Firm*—Varndell Legal Group

[57] ABSTRACT

A route searching system having node data 3 representing information on positions and attributes of the same, intersection data 1 representing information on intersections, road data 2 representing information on roads, and a route searching section 4 for searching for the optimum route from the intersection data and the road data. Weighted information based on road circumstances is included in the road data, and weighing is performed in accordance with the weighted information with respect to possible routes searched by the route searching section to find the optimum route. This system enables the time taken for traveling along a selected course to be computed with reference to the weighted information and enables route searching to be performed in short period of time. Also, intersections to be passed without turning can readily be removed to prepare guidance data only from data necessary for guidance.

7 Claims, 9 Drawing Sheets

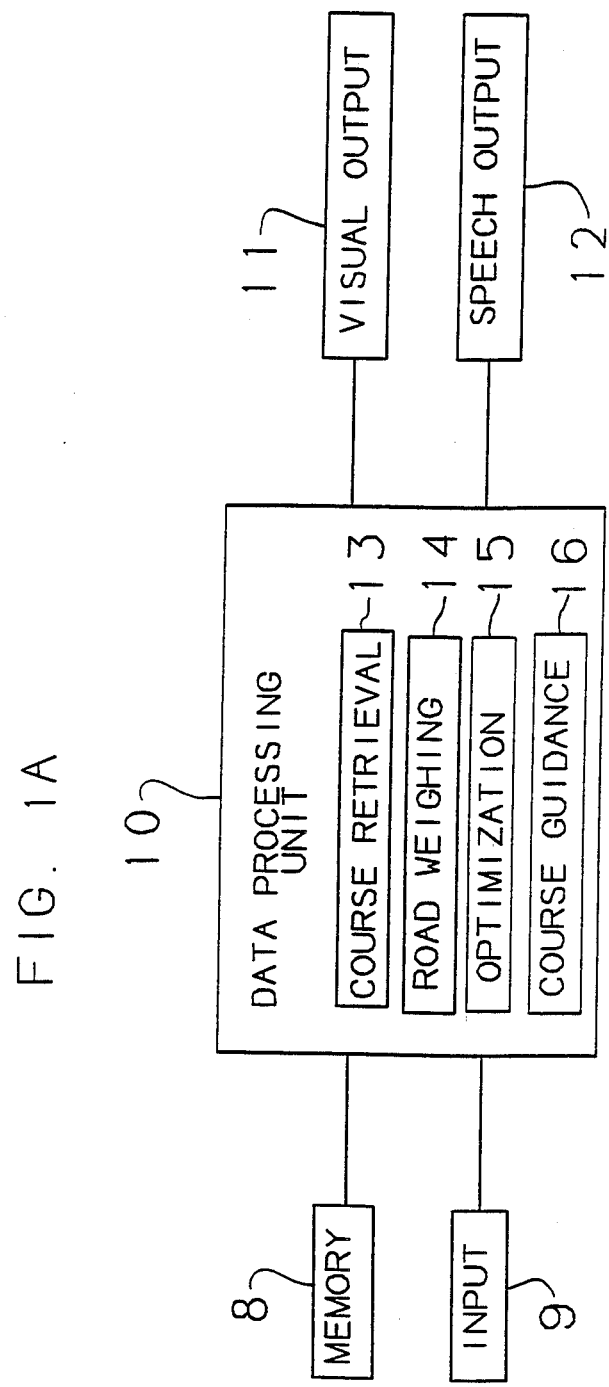

FIG. 2(b)

| INTERSECTION NO. | INTERSECTION NAME | SMALLEST OF ROAD NUMBERS DESIGNATING ROADS STARTING FROM CORRESPONDING INTERSECTION | SMALLEST OF ROAD NUMBERS DESIGNATING ROADS TERMINATING AT CORRESPONDING INTERSECTION | EXISTENCE OF TRAFFIC SIGNAL |
|---|---|---|---|---|
| I | KANDA | 1 | 2 | YES |
| II | YUSHIMA | 2 | 1 | YES |
| III | — | 4 | 3 | NO |
| IV | — | 6 | 5 | |

FIG. 2(c)

| ROAD NO. | STARTING POINT | TERMINAL POINT | SECOND OF ROAD NUMBERS DESIGNATING ROADS HAVING SAME STARTING POINT | SECOND OF ROAD NUMBERS DESIGNATING ROADS HAVING SAME TERMINAL POINT | WIDTH OF ROAD | PROHIBITION ① | PROHIBITION ② | NO NEED FOR GUIDANCE | PHOTOGRAPH NO. | NUMBER OF NODES | TOP ADDRESS OF NODE SERIES DATA | LENGTH |
|---|---|---|---|---|---|---|---|---|---|---|---|---|
| 1 | I | II | 7 | 4 | 1 | — | — | 3 | 1 | 15 | 100 | |
| 2 | II | I | 3 | 8 | 1 | — | — | 7 | 2 | 13 | 200 | |
| 3 | II | III | 2 | 3 | 2 | — | — | 5 | 3 | 9 | 300 | |
| 4 | III | II | 5 | 6 | 2 | — | — | 2 | 4 | 20 | 500 | |
| 5 | III | IV | 4 | 7 | 2 | 6 | — | 8 | 5 | 25 | 600 | |
| 6 | IV | II | 8 | 1 | 1 | 3 | 2 | — | 6 | 30 | 700 | |
| 7 | I | IV | 1 | 5 | 0 | — | — | — | 7 | 9 | 800 | |
| 8 | IV | I | 6 | 2 | 0 | — | — | 1 | 8 | 3 | 900 | |

FIG. 2(d)

| ADDRESS | EAST LONGITUDE | NORTH LATITUDE | ATTRIBUTE |
|---|---|---|---|
| | 135.5 | 35.1 | 01 |
| | 135.6 | 35.2 | 01 |
| 100 | | | |
| 200 | | | |

| INTERSECTION NAME |
|---|
| INTERSECTION NUMBER |
| PHOTOGRAPH NUMBER |
| ANGLE |
| DISTANCE |
| INTERSECTION NAME |

(b)

| EAST LONGITUDE |
|---|
| NORTH LATITUDE |
| INTERSECTION NUMBER |
| ATTRIBUTE |
| ANGLE |
| DISTANCE |
| EAST LONGITUDE |

4,926,336

ROUTE SEARCHING SYSTEM OF NAVIGATION APPARATUS

BACKGROUND OF THE INVENTION

This invention relates to a route searching system of a navigation apparatus used for finding the shortest route from a given point to a destination.

Navigation apparatus are known which are used to guide a driver who is not particularly familiar with a region to his destination in that region by selecting a suitable course leading thereto. Apparatus of this kind are now being developed eagerly.

In a conventional navigation apparatus, a course along which a driver will be led to his destination is set on the basis of a starting point and a destination point which are input before the driver starts traveling. The driver navigates along the course thereby set. There are various systems of designating a desired course during navigation, such as one in which a map is displayed on a CRT screen and an image of the course is superposed on the map. Another system displays information about an intersection where the driver needs to turn the vehicle in accordance with a predetermined course which information includes numerals or a graph indicating the distance remaining until the intersection is reached and a picture showing certain features of the intersection. A further system makes use of speech output as an auxiliary means.

Ordinarily, in a road system, a plurality of courses which connect a starting point and a destination point could in theory be selected. For this reason, various methods of searching for a shortest-time or shortest-distance course (shortest course) between a desired starting point and destination point have been proposed for use in such navigation apparatus. One example of such a method has been reported in which an intersection, such as that shown in FIG. 9, is represented by eight nodes and sixteen directional links to express left and right turns, straight-ahead travel and U-turns, and in which each of the roads connecting the intersections are represented by a pair of directional links. In another example (such as the one disclosed in Japanese Patent Laid-Open No. 62-91811), the shortest course is found by comparing data on courses along which travel is prohibited, and if travel is prohibited, the course is removed, thereby finding the shortest courses which includes no impassable section.

The former method entails a problem, however, in that all items of information on left/right turns at intersections are represented by directional links, so the total quantity of data and, hence, the memory capacity is high. In addition, a process of finding a shortest-time course from data having a conventional data structure by detecting left and right turns and weighing data items with the detected left and right turns requires a complicated process of computation for determining left and right turns, resulting in an increased searching time. Specifically, where a crossroad is represented by eight nodes and sixteen directional links, weighted items of data on distance or time must be prepared with respect to each of the sixteen directional links.

SUMMARY OF THE INVENTION

It is an object of the present invention to provide a route searching system of a navigation apparatus capable of searching for the optimum route while rating course conditions.

It is another object of the present invention to provide a route searching system capable of searching for the optimum route on the basis of information concerning left/right turn or straight-ahead travel, the width of roads and left/right turn prohibition.

It is still another object of the present invention to provide a route searching system capable of searching possible routes with a reduced quantity of data on roads necessary for route searching.

It is a further object of the present invention to provide a route searching system where weighing with respect to left/right turn can be effected by a simple processing.

To these ends, the present invention provides a route searching system of a navigation apparatus for determining a course between designated starting and destination points and performing guidance along the course. The route searching system of the present invention has means for storing node data including information on positions and attributes of the same, intersection data including information on intersections and road data including information on roads, and a route searching means for searching for the optimum route on the basis of the intersection data and the road data. In the present invention, weighted information concerning the road circumstances is included in the road data, and the weighing thereof is effected in accordance with the weighted information with respect to possible routes searched by the route searching means to find the optimum route.

With this arrangement, free-of-guidance information and weighted information based on road circumstances, such as the dimensions of roads, are included in the road data, the optimum route is found by searching the routes with the route searching means while weighing the weighted information. It is thereby possible to compute the time taken for traveling along a selected course with reference to the weighted information and as well as to perform route searching in a short period of time. Also, intersections to be passed without turning can readily be removed so as to only prepare guidance data from data necessary for guidance.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 1A is a block diagram of a navigation apparatus which represents an embodiment of the present invention;

FIGS. 2(b) to 2(d) are tables of intersection data, road data and node series data;

FIG. 8 shows the diagrams of structures of intersection series data and node series data;

DESCRIPTION OF THE PREFERRED EMBODIMENTS

An embodiment of the present invention will be described below with reference to the accompanying drawings.

Figure 1:
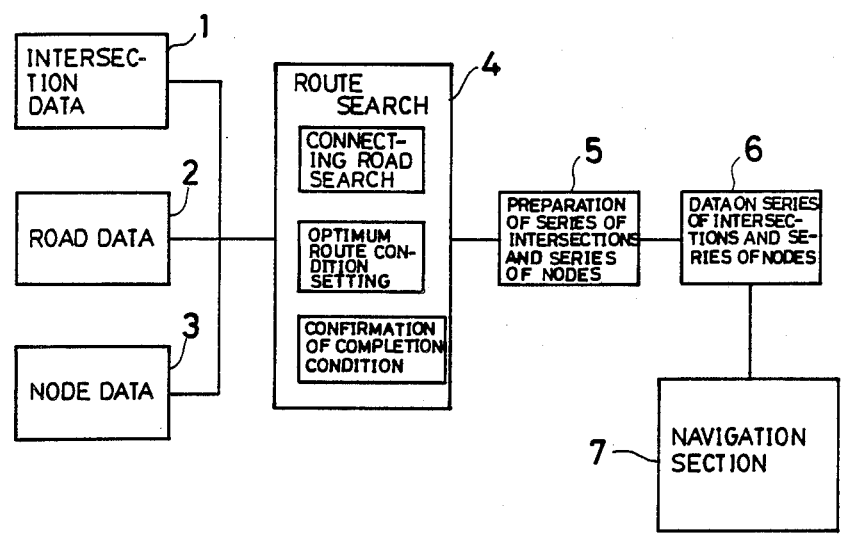
FIG. 1 is a block diagram of a route searching system of a navigation apparatus which represents an embodiment of the present invention.

Referring to FIG. 1, a route searching system has data 1 concerning intersections, data 2 concerning roads, data 3 concerning nodes, a route search processing section 4, a section 5 for forming a series of intersections and a series of nodes, data 6 concerning the series of intersections and the series on nodes thereby formed, and a navigation section 7. The route search processing section 4 has a connecting road search subroutine for finding roads that connect to an intersection except for entrance-prohibited roads, such as roads which cannot be entered if to do so would involve an illegal turning to the left or right; an optimum route condition setting subroutine for setting conditions, such as the width of roads to be selected, need for guidance, and so forth; and a completion condition subroutine for determining whether or not route searching has been completed. The route search processing section 4 thereby searches for the optimum route between a starting point and a destination point. The intersection/node series forming section 5 forms data 6 concerning a series of intersections and a series of nodes in coincidence with the optimum route thereby found. The navigation section 7 conducts navigation on the basis of the intersection/node series data 6. The navigation section 7 has a data processing means and a means for outputting visual display and speech, and is adapted to read out the intersection/node series data 6 at predetermined points on the course to be traveled and to perform guidance along the course with the aid of visual display and speech outputs.

Referring to FIG. 1A, an apparatus has a memory 8 for storing intersection data, road data, and node data, an input 9 for inputting departure and destination points, a data processing unit 10 for reading memory 8 and input 9 which includes course guidance 16 for providing guidance information via visual output 11 and speech output 12. The data processing unit 10 also includes a course retrieval 13, road weighing 14, and optimization 15.

Figure 2A:
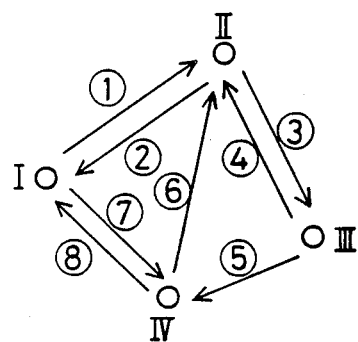
FIG. 2(a) is a diagram of a road system.

Data concerning the road network includes groups of data items: intersection data items such as those shown in FIG. 2(b); road data items such as those shown in FIG. 2(c); and node data items such as those shown in FIG. 2(d), assuming if the road network is represented by intersection numbers I to IV and road numbers ① to ⑧, as shown in FIG. 2(a).

That is, as shown in FIG. 2(b), the intersection data is constituted by, in correspondence with intersection numbers I to IV, intersection names, the smallest number of road numbers designating roads starting from the corresponding one of the intersections I to IV, the smallest number of road numbers designating roads terminating at the corresponding one of intersections I to IV, and values each representing existence or absence of traffic signals.

As shown in FIG. 2(c), the road data is constituted by, in correspondence with road numbers ① to ⑧, starting and terminal points indicated by intersection numbers I to IV, numbers corresponding to the second of road numbers designating roads having the same starting point, numbers corresponding to the second of road numbers designating roads having the same terminal point, the widths of the roads, prohibition information, free-of-guidance information, photograph numbers, the numbers of nodes, top addresses of node series data, and the lengths of the roads.

The node data is constituted by east longitudes, north latitudes and attributes, as shown in FIG. 2(d). As is apparent from the road data, the unit road indicated by each road number is defined by a plurality of nodes. That is, the node data relates to points on the roads. If something connecting a pair of nodes is called an arc, a road can be expressed by connecting, with an arc, each of adjacent pairs of nodes constituting a series of a plurality of nodes. For example, with respect to road number ①, the number of nodes is 15 and the top address of the corresponding node data items is 100. The road number ① therefore designates a series of fifteen nodes represented by node data items with addresses 100 to 114.

On the basis of the above-described network data, with respect to a course starting from, for example, intersection number I, a road number ① is first found from starting point information of the intersection data, and road number ⑦ is then found in "second of road numbers designating roads having same starting point" of the road data. Conversely, from the corresponding information relating to road number ⑦, road number ① is found, thereby determining that there is no connecting roads represented by other road numbers. Data items relating to terminal points can be read out in a similar manner. With respect to the road number ⑤ in the road data, the road number ⑥ designates prohibition. Correspondingly, in the network shown in FIG. 2(a), travel along a route indicated by the road numbers ⑤ and ⑥ through the intersection indicated by the intersection number IV is prohibited due to the existence of no-left/right-turn prohibition. Only travel along a route indicated by the road number ⑧ is allowed. In practice, there is no need for guidance in the direction of road number ⑧. Thus, the road data has road numbers designating entrance prohibition such as no-left/right-turn, as well as road numbers designating cases where there is no need for guidance, thereby enabling a reduction in the information memory capacity and facilitating route searching.

The flow of route search processing based on the above-described network data will be described below with reference to FIG. 3. In the flow chart of FIG. 3, c represents the intersection number; L(c), the distance; F(c), flag; R(c), a road number designating a traveled road; s0 and s1, intersection numbers designating intersections adjacent to a starting point; and e0 and e1, intersection numbers designating intersections adjacent to a destination. F(c)=0 indicates the unsearched state, F(c)=1 indicates searching, and F(c)=2 indicates completion of searching.

① With respect to all intersections:
distance L(c) is set to infinite (∞), and
flag F(c) is set to "0" (unsearched state).

The initialization is thus performed, so that all the intersections are regarded as unsearched and the distance between the starting point and each intersection as infinite.

② The distance from the starting point are substituted for distances L(s0) and L(s1) corresponding to intersection numbers s0 and s1 adjacent to the starting point, flags F(s0) and F(s1) corresponding to intersection numbers s0 and s1 adjacent to the starting point are set to "1", and the road number indicating the route from the starting point is set as the road number designating the passed route is set to t.

③ Intersection numbers are searched to find intersection number c0 which satisfies the condition that flag F is not "2" and the distance L(c) is minimum.

④ The connecting road search subroutine is executed to search for connecting roads starting from intersection number c0.

⑤ Whether or not there is any connecting road is examined.

In the case of YES, the process proceeds to the next step ⑥. In the case of NO, the process proceeds to step 11.

⑥ The optimum route condition setting subroutine is executed to set road circumstances and other conditions for searching for the optimum road.

⑦ The intersection number corresponding to the terminal end of the present road is set to c1 and the length of the road is set as l.

⑧ The distance P to the terminal end of the present road is calculated:

$$P = L(c0) + l$$

(where L(c0) is the distance between the starting point and the intersection and P is the distance from the intersection number (c). P is obtained as the distance through which the terminal end of the road (examined for searching) corresponding to the intersection number c1 is reached via the same road.

⑨ Whether or not the condition that $P < L(c1)$ and $F(c1) \neq 2$ is satisfied is examined.

In the case of YES, the process proceeds to the next step ⑩. In the case of NO, the process returns to step ④.

⑩ The distance between the starting point and the intersection corresponding to intersection number c1 is set to P, corresponding flag F(c1) is set to "1", and road number R(c1) indicating the route traveled until the intersection corresponding to intersection number c1 is reached is set as the road number of the route examined for searching.

⑪ If NO in step ⑤, F(c0) is set to "2".

⑫ The completion condition confirmation subroutine is executed.

⑬ Whether or not the processing has been completed is examined. In the case of NO, the process proceeds to step 3. In the case of YES, the processing is ended.

As a result of this processing, with respect to each intersection number, the road number indicating the optimum course from the starting point to the intersection corresponding to each intersection number is set.

Figure 4:
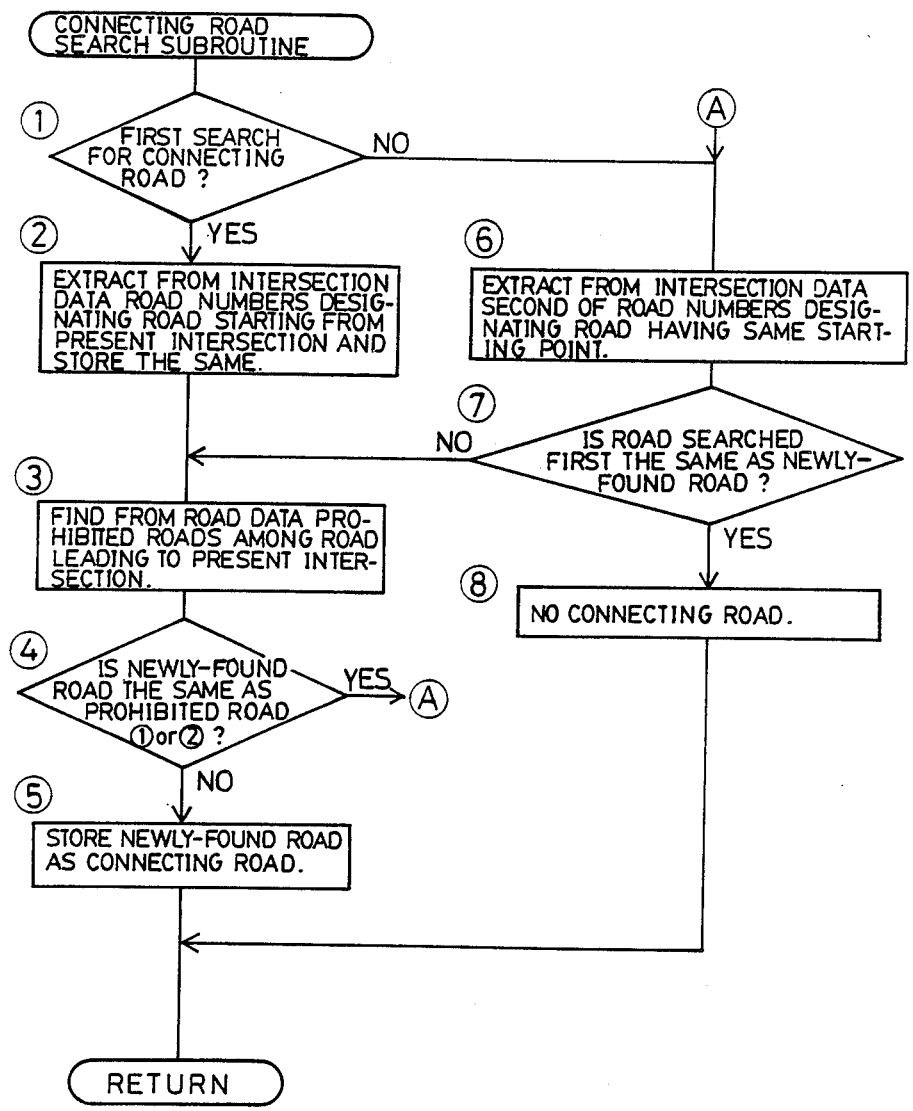
FIG. 4 is a flow chart of connecting road search subroutine.

The connecting road search subroutine in step ④ is conducted in accordance with the flow diagram shown in FIG. 4, as described below.

① Whether or not the present searching is initial searching is examined.

In the case of YES, the process proceeds to step ②.
In the case of NO, the process proceeds to step ⑥.

② A road number indicating a route starting from the present intersection c0 is extracted from the intersection data shown in FIG. 2(b) and is stored.

③ A road number indicating a prohibited road connected to the intersection c0 examined for searching is read out from the road data shown in FIG. 2(c).

④ Whether or not the newly-extracted road corresponds to the prohibited road is examined. In the case of YES, the process proceeds to step ⑥. In the case of NO, the process proceeds to step ⑤.

Figure 3:
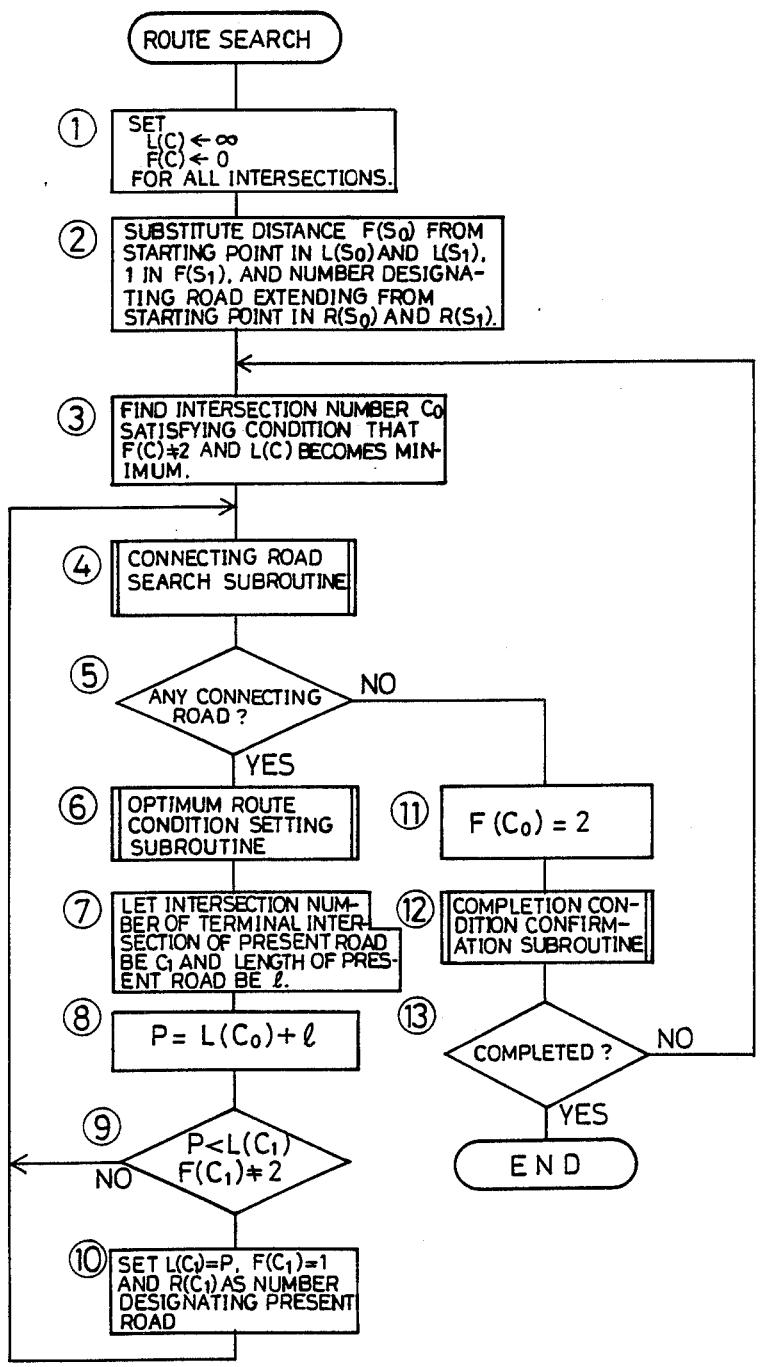
FIG. 3 is a flow chart of route search processing.

⑤ The newly-extracted road is stored as a connecting road and the process returns (to step ⑤) of FIG. 3.

⑥ A road number which indicates a road having the road previously found and which is next to the road number indicating the previously-found road is extracted from the road data.

⑦ Whether or not the previously-found road and the newly-extracted road are the same is examined.

In the case of YES, the process proceeds to the next step ⑧. In the case of NO, the process returns to step ③.

⑧ A determination that there is no connecting road is made and then the process returns.

Figure 5:
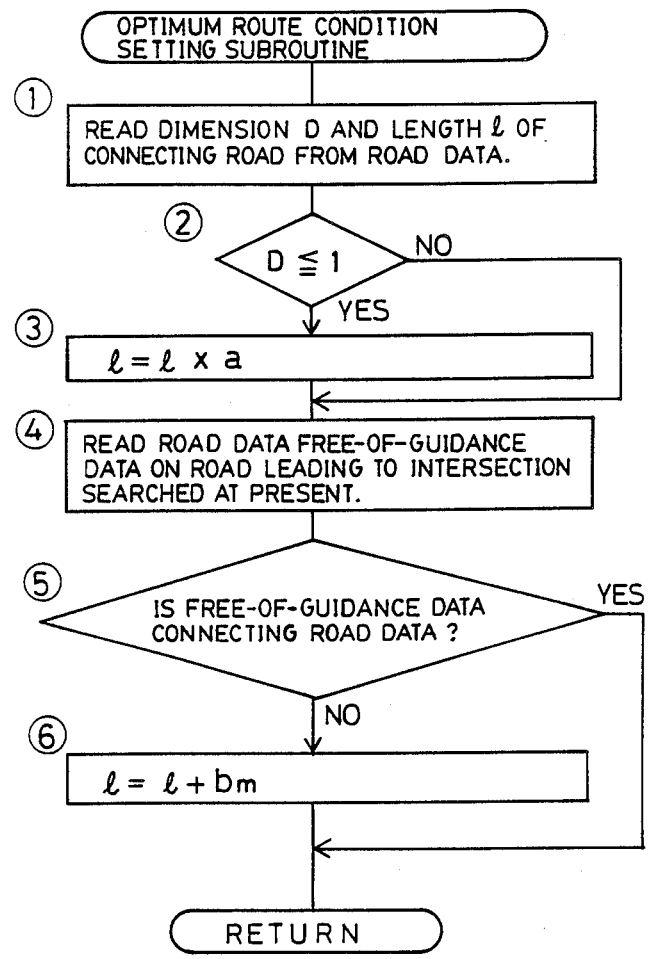
FIG. 5 is a flow chart of optimum course condition setting subroutine.

The optimum route condition setting subroutine in step ⑥ of FIG. 3 is conducted in accordance with the flow diagram such, as that shown in FIG. 5, as described below.

① The dimension D and the length l of each connecting road are read from the road data.

② Whether or not the dimension D of each connecting road is equal to or smaller than 1 is examined.

In the case of YES, the process proceeds to step ③. In the case of NO, the process proceeds to step ④.

③ The value of l is multiplied by a. That is, if a road having a dimension larger than 1 is regarded as an ordinary wide road while a road having a dimension equal to or smaller than 1 is regarded as a narrow road, the narrow road is rated at a value in terms of distance a times higher than that of the wide road. The number a is therefore larger than 1.

④ Free-of-guidance data relating to the road traveled to the intersection presently examined for searching is read from the road data.

⑤ Whether or not there is any connecting road in correspondence with the free-of-guidance data is examined.

In the case of YES, the process returns. In the case of NO, the process proceeds to step ⑥.

⑥ $b_m$ is added to l to set another new value of l, and the process returns. That is, an intersection at which guidance for, for example, left or right turn is required is rated at a value larger than the guidance-free intersection by b in terms of distance.

Figure 6:
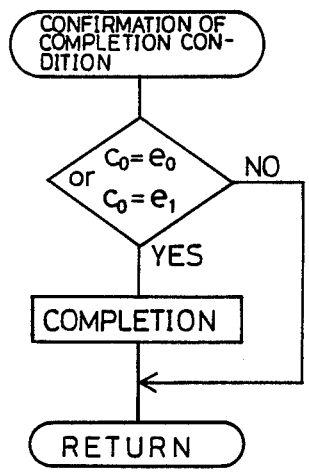
FIG. 6 is a flow chart of completion condition confirmation subroutine.
Figure 9:
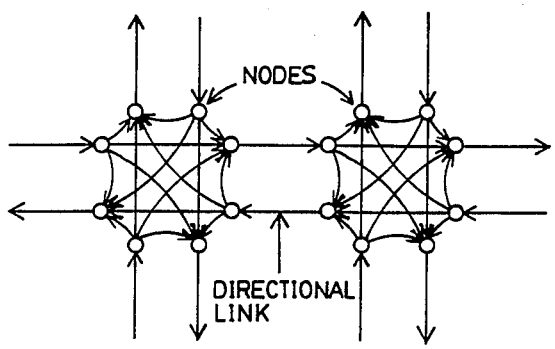
FIG. 9 is a diagram of intersection information constituted by nodes and directional links, illustrating a conventional route search method.

In the completion condition confirmation subroutine, as shown in FIG. 6, whether or not intersection number c0 indicating the intersection examined for searching and one of the intersection numbers indicating adjacent intersections of the destination coincide with each other is examined, and a completion flag, for example, is set on condition that coincidence is found.

Figure 7:
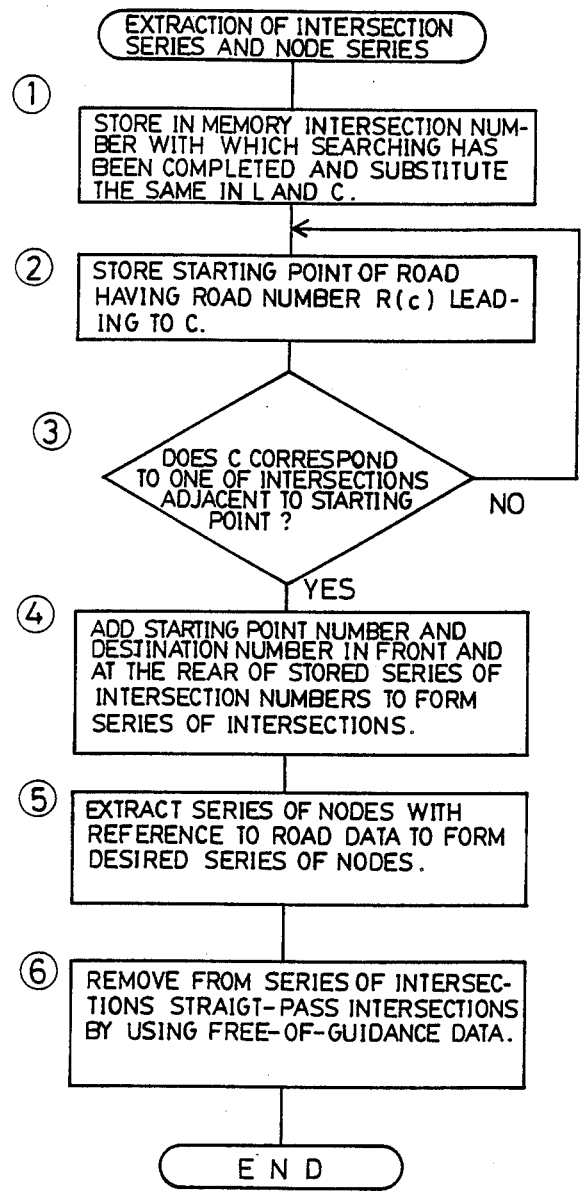
FIG. 7 is a flow chart of the process of extracting a series of intersections and a series of nodes.

As described above, in the route searching in accordance with the present invention, the distance between intersections is weighed in consideration of the dimension of the connecting road and travel conditions relating to the need for guidance, thus searching for the shortest route. As a result, items of road number information in coincidence with the optimum course can be obtained with respect to the intersections. It is therefore possible to prepare data on a series of intersections and series of nodes in accordance with the processing flow of FIG. 7 on the basis of the results of searching, as described below.

① The intersection number indicating one of the intersections which has been examined for searching is stored in the memory.

② The starting end of the road extending from that intersection is stored in the memory.

③ Whether or not the intersection coincides with one of intersections adjacent to the starting point is examined.

In the case of YES, the process proceeds to the next step ④. In the case of NO, the process returns to step ②.

④ A starting number and a destination number are placed in front and at the rear of the stored series of intersection numbers, thereby forming a series of intersections.

⑤ Data on a series of nodes between intersections is extracted from the road data to form the series of nodes.

⑥ Guidance-free intersections are removed from the series of intersections by using the free-of-guidance data.

FIG. 8 shows examples of items of data on the series of intersections and the series of nodes obtained as described above. As shown in FIG. 8(a), the intersection series data is constituted by various items including intersection names, intersection numbers, photograph numbers indicating photographs of specific views of intersections, turning angles and distances. As shown in FIG. 8(b), the node series information is constituted by east longitudes and north latitudes representing the positions of nodes, intersection numbers, attributes, angles and distances. These items of data are provided only for intersections where guidance is needed except for guidance-free intersections. During navigation, therefore, it is sufficient to read out and output these items of data in correspondence with the predetermined positions.

As described above, searching is conducted while the left/right turn prohibition data is checked, thereby searching for courses which include no section where the driver is stopped from traveling by left or right turn prohibition.

The present invention is not limited to the above-described arrangement, and it can be modified in various way. For example, the route search processing is started at the destination of navigation although it is started at the starting point in the described embodiment. Also, the route search processing may be conducted until all the flags are set to "2", that is, until all searching is performed with respect to all the intersections although in the described embodiment searching is ended when the destination is reached after the searching has been started at the starting point. If the route searching is conducted from the destination, information on optimum courses from all the intersections can be obtained. It is thereby possible to form a new series of intersections and series of nodes from a nearby intersection without performing route searching again in a case where the vehicle deviates from the determined course at an intermediate point.

In accordance with the present invention, as is clear from the above description, intersection data, road data and node data are previously stored in a memory means such as a CD-ROM, these kinds of data are read to a RAM or the like before route searching is started, and route searching for the optimum route is conducted while courses are rated by checking road circumstances including designation of right/left turn or straight-ahead travel, the width of a road, left/right turn prohibition, and so forth, thereby enabling speed-up of route searching. Since left/right prohibition data is provided by being included in the road data, it is possible to reduce the total quantity of data and, hence, the memory capacity. In addition, the provision of free-of-guidance data makes it possible to determine optimum selection from straight-ahead travel and turning to the left or right and enables a reduction in the quantity of data for route searching performed in a minimized period of time. Moreover, it is possible to perform, by a simple processing, the operation of removing intersections through which the vehicle must travel without turning from the series of intersections by finding such intersections from the free-of-guidance data to prepare data only on intersections where the vehicle must turn to the left or right.

What is claimed is:

1. A navigation apparatus for a vehicle having intersection data concerning positions of intersections, road data including data concerning distances of roads between said intersections and characteristic feature data about said roads,
   input means for inputting departure and destination points,
   course retrieval means for retrieving an optimum course from said departure point to said destination point, and
   course guiding means for providing guidance along said retrieved course by at least one of a visual display output and a speech output; said course retrieval means including:
   road weighing means for weighing said distances of roads between intersections by adding or subtracting distances corresponding to said characteristic feature data respectively to or from each of said distances; and
   optimization means for providing said optimum course corresponding to a minimum distance between said input departure and destination points based on said weighed distances.

2. A navigation apparatus according claim 1, wherein said characteristic feature data includes data concerning widths of roads.

3. A navigation apparatus according to claim 1, wherein said characteristic feature data includes data indicative of whether a road passing through an intersection is a straight road.

4. A navigation apparatus for a vehicle, which comprises: memory means for storing intersection data and road data, said road data including distances between intersections and characteristics of roads;
   navigation means for receiving input departure and destination points, said navigation means including output means for periodically providing guidance information by at least one of a visual display output and a speech output in accordance with an optimum travel course;
   course retrieving means for retrieving said intersection data and said road data from said memory means including intersections between said departure and destination points and distances between said intersections;

road weighing means for adjusting said retrieved distances between said intersections based on said characteristics of roads; and optimization means for setting said optimum travel course between said input departure and destination points based on said adjusted distances.

5. A navigation apparatus according to claim 4, wherein said optimization means adjusts said retrieved distances based on at least two different characteristics of each road.

6. A navigation apparatus according to claim 4, wherein said characteristic feature includes widths of roads.

7. A navigation apparatus according to claim 4, wherein said characteristic feature includes data indicative of whether said road passes through an intersection without turning.

* * * * *